(12) United States Patent
Strigel et al.

(10) Patent No.: US 11,876,540 B2
(45) Date of Patent: Jan. 16, 2024

(54) PROCESSING OF LOSSY-COMPRESSED ADAS SENSOR DATA FOR DRIVER ASSISTANCE SYSTEMS

(71) Applicant: Conti Temic microelectronic GmbH, Ingolstadt (DE)

(72) Inventors: Elias Strigel, Wangen (DE); Stefan Heinrich, Achern (DE); Dieter Krökel, Eriskirch (DE); Thomas Fechner, Wasserburg (DE); Martin Pfitzer, Bodolz (DE); Robert Thiel, Niederstaufen (DE)

(73) Assignee: Conti Temic microelectronic GmbH, Ingolstadt (DE)

( * ) Notice: Subject to any disclaimer, the term of this patent is extended or adjusted under 35 U.S.C. 154(b) by 0 days.

(21) Appl. No.: 17/754,129

(22) PCT Filed: Jul. 16, 2020

(86) PCT No.: PCT/DE2020/200059
§ 371 (c)(1),
(2) Date: Mar. 24, 2022

(87) PCT Pub. No.: WO2021/058066
PCT Pub. Date: Apr. 1, 2021

(65) Prior Publication Data
US 2022/0294467 A1 Sep. 15, 2022

(30) Foreign Application Priority Data
Sep. 24, 2019 (DE) ..................... 10 2019 214 587.6

(51) Int. Cl.
H03M 7/30 (2006.01)
(52) U.S. Cl.
CPC ....... *H03M 7/3059* (2013.01); *H03M 7/6005* (2013.01)

(58) Field of Classification Search
CPC ... H03M 7/3059; H03M 7/6005; H04N 7/183
See application file for complete search history.

(56) References Cited

U.S. PATENT DOCUMENTS

2013/0063597 A1 3/2013 Wender et al.
2016/0375925 A1* 12/2016 Lubischer .............. B62D 1/183
 701/41
(Continued)

FOREIGN PATENT DOCUMENTS

DE 102011113265 B3 11/2012
EP 3171553 A1 5/2017

OTHER PUBLICATIONS

German Search Report dated Mar. 20, 2020 for the counterpart German Patent Application No. 10 2019 214 587.6.
(Continued)

*Primary Examiner* — Jean B Jeanglaude

(57) ABSTRACT

Example embodiments relate to an ADAS sensor data processing unit, to an ADAS sensor system and to an ADAS sensor data evaluation method for use in driver assistance systems or systems for the automated driving of a vehicle. The ADAS sensor data processing unit includes an input interface, a decompression module, a processing unit and an output unit. The input interface is designed to receive data of an ADAS sensor that have been subjected to lossy compression by a compression module. The decompression module is designed to decompress the compressed data of the ADAS sensor. The processing unit is designed to process the decompressed data (IdSD) of the ADAS sensor, information relevant to an ADAS/AD function being ascertained from the decompressed sensor data. The output unit is designed to output the ascertained information relevant to the ADAS function.

16 Claims, 3 Drawing Sheets

(56) References Cited

U.S. PATENT DOCUMENTS

| | | | |
|---|---|---|---|
| 2017/0232975 A1* | 8/2017 | Burk | B60W 50/14 |
| | | | 701/48 |
| 2018/0167083 A1* | 6/2018 | Dubey | H03M 7/6064 |
| 2019/0075263 A1 | 3/2019 | Mlinar et al. | |
| 2019/0141275 A1* | 5/2019 | Galluzzi | H04N 5/38 |
| 2021/0056317 A1* | 2/2021 | Golov | G06T 3/40 |
| 2021/0127090 A1* | 4/2021 | Kale | H04N 7/18 |

OTHER PUBLICATIONS

The International Search Report and the Written Opinion of the International Searching Authority dated Oct. 27, 2020 for the counterpart PCT Application No. PCT/DE2020/200059.

* cited by examiner

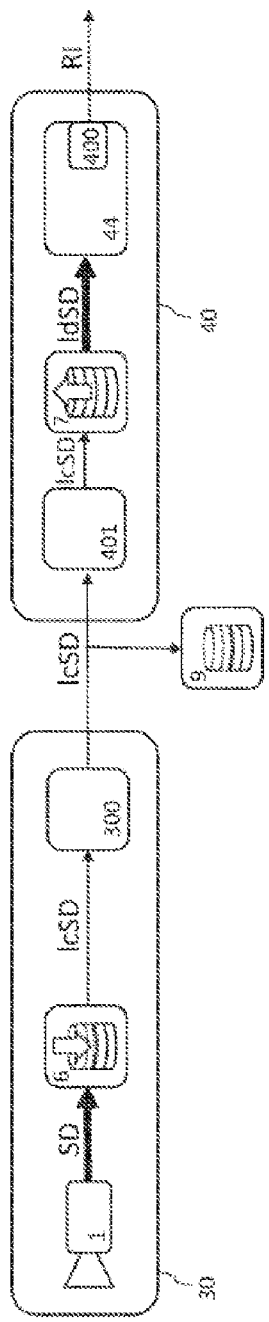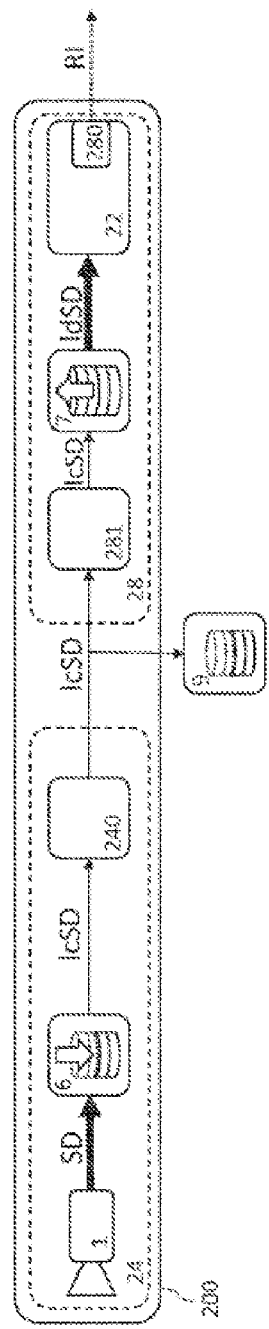

PROCESSING OF LOSSY-COMPRESSED ADAS SENSOR DATA FOR DRIVER ASSISTANCE SYSTEMS

CROSS REFERENCE TO RELATED APPLICATIONS

This application claims priority to PCT Application PCT/DE2020/200059, filed Jul. 16, 2020, which claims priority to German Application 10 2019 214 587.6, filed Sep. 24, 2019. The disclosures of the above applications are incorporated herein by reference.

FIELD OF INVENTION

The invention relates to an ADAS sensor data processing unit, to an ADAS sensor system and to an ADAS sensor data evaluation method for use in driver assistance systems or systems for the automated driving of a vehicle.

BACKGROUND

The number of ADAS (Advanced Driver Assistance Systems) or environment capturing sensors in vehicles for extensively assisted or automated driving (AD, Automated Driving) is rising sharply. The data quantity of the individual ADAS sensors is likewise increasing. For example, future image sensors of ADAS cameras will have more and more pixels in order to capture objects in a better resolution with a larger detection range (Field of View).

As the data quantity of the ADAS sensor networks in the vehicle increases, solutions for compressing the data are sought.

SUMMARY

One objective is to reduce the data quantity of the ADAS sensor data to be transmitted on the vehicle bus.

Current systems in the ADAS sector use lossless compression algorithms in order to reduce the data quantity. However, the compression rates attained during this are limited.

A first aspect of the present disclosure relates to using lossy compression algorithms, with which significantly higher compression rates can be attained, during the transmission of ADAS sensor data.

A further aspect relates to the architecture of ADAS sensor data processing units and sensor systems for evaluating lossy-compressed ADAS sensor data.

A further aspect relates to a reduction in the data to be stored for a subsequent evaluation for developing, testing and possibly validating the algorithms.

One Fundamental Consideration is the Following:

If a decision is made to the effect that a lossy compression is to be used for storing the development and test sensor data and also for the transmission between an ADAS sensor (e.g., of a satellite camera) and a computer unit (or processing unit) for processing the ADAS sensor data (e.g., of a central control device for assisted or automated driving, ADCU), this has the following consequences:

The algorithms used on the computer unit must be specially developed for lossy data or their suitability must at least be demonstrated for the lossy data.

If the same algorithms are also used in an "intelligent" ADAS sensor (sensor data capturing and computer unit as "one box"), lossy data must also be used here. This is the only possible way to guarantee that the algorithms behave similarly and to validate the algorithms on the basis of the recorded data.

An ADAS sensor data processing unit according to the present disclosure comprises an input interface, a decompression module, a processing unit and an output unit. The input interface is designed to receive data of an ADAS sensor that have been subjected to lossy compression by a compression module. The decompression module is designed to decompress the compressed data of the ADAS sensor. The processing unit is designed to process or evaluate the decompressed data of the ADAS sensor, information relevant to an ADAS/AD function being ascertained from the decompressed sensor data. The output unit is designed to output the ascertained information relevant to the ADAS/AD function.

An ADAS sensor system according to the present disclosure for a vehicle comprises at least one ADAS sensor, a compression module having a data output interface and an ADAS sensor data processing unit according to the invention.

The ADAS sensor is designed to generate data regarding the captured environment of the vehicle and to transmit said data to the compression module. The compression module is designed to subject the sensor-generated data to lossy compression. The data output interface is designed to output the compressed sensor data to the input interface of the ADAS sensor data processing unit.

Advantages of using a lossy compression are a lower required amount of memory during development for the persistent storage of recorded sensor data, a lower required bandwidth for transmitting the sensor data to the computer unit and a lower bandwidth for transmitting the data within the "intelligent" ADAS sensor.

According to a preferred further development, the ADAS sensor system (only) comprises a housing and the ADAS sensor data processing unit is integrated into the housing, e.g., as a SoC (System on Chip). The ADAS sensor system can also be referred to as an intelligent, smart or one-box sensor system. Such a smart sensor system provides in particular for a "simultaneous" operation of a compression module and of a decompression module "behind one another." The special feature is that, within the ADAS sensor system, the sensor-generated data are first of all subjected to lossy compression by means of an integrated compression module, in order to then be unpacked again by the integrated decompression module. From a conventional point of view, this seems to be inconvenient or even preposterous within a sensor, since it is accepted that the processing unit processes the lossy decompressed ADAS sensor data and not the "complete" raw data which would be available at another location within the ADAS sensor system.

An alternative advantageous configuration of the ADAS sensor data processing unit provides that the ADAS sensor data processing unit is an external unit that can be connected, in a wired or wireless manner, to an ADAS sensor system arranged separately in the vehicle (as a general rule, without its own integrated data processing unit). Such an external ADAS sensor processing unit can in particular be a central control device for ADAS/AD functions of the vehicle (ADCU).

In other words, the invention relates to the arrangement of a data compression unit, followed by a decompression unit, within an ADAS sensor or an ADAS camera. This can, in one case, be a one-box smart sensor/camera or a two-box sensor/camera having a separate sensor head and transmission route to a processing box. If subjected to lossy compression, the algorithms for sensor data evaluation must be adapted to said lossy data or at least be validated. If the same algorithms are used in a smart sensor (one box) and separate sensor having an additional computing unit (two boxes), the sensor data must be compressed in the smart sensor following the capturing and are subsequently decompressed (or simply only "transcoded"). This guarantees the same output conditions for the sensor data evaluation algorithms.

The ADAS sensor of the ADAS sensor system or for the ADAS sensor data processing unit can preferably be a camera sensor and the ADAS sensor data are accordingly image data. For example, the ADAS camera sensor generates image data which are present in a lossy-compressed form at the input interface of the ADAS sensor data processing unit. The sensor data processing corresponds, in this case, to an image processing.

The processing unit can preferably be an image processing unit, or image processing algorithms can be implemented on the processing unit so that the processing unit is designed to detect objects, lane markings, road signs, traffic light signals, light sources and/or to spatially reconstruct the vehicle environment.

According to an advantageous further development, the ADAS sensor data processing unit for image data comprises an optical flow calculation module which is designed to ascertain the optical flow between uncompressed image data of two individual images captured at different times by the camera sensor and to provide the ascertained optical flow to a processing unit.

A further subject-matter of the invention relates to an image pre-processing module for an ADAS camera sensor system according to the present disclosure, comprising an input unit, an optical flow calculation module, a compression module and an output unit. The input unit is designed to receive uncompressed image data from an ADAS camera sensor. The optical flow calculation module is designed to determine the optical flow between uncompressed image data of two individual images captured at different times by the ADAS camera sensor. The compression module is designed to subject the uncompressed image data received by the ADAS camera sensor to lossy compression. The output unit is designed to output the ascertained optical flow and the compressed image data to the input interface of an ADAS sensor data processing unit according to the invention for camera image data.

A corresponding ADAS sensor data processing unit is preferably provided for camera image data, wherein the processing unit of the ADAS sensor data processing unit is designed to take account of the provided, ascertained optical flow during the processing of the (lossy-) decompressed image data of the camera sensor.

The present disclosure further relates to a vehicle having an ADAS sensor data processing unit according to the invention or an ADAS sensor system according to the invention, optionally having an ADAS camera system and an image pre-processing module according to the invention.

A (Computer-Implemented) ADAS Sensor Data Evaluation Method According to the Present Disclosure Comprises the Steps of
  a) receiving lossy-compressed data of an ADAS sensor system of a vehicle,
  b) decompressing the lossy-compressed data,
  c) processing the decompressed data in order to ascertain information relevant to an ADAS function, and
  d) outputting the ascertained information relevant to the ADAS function.

Furthermore, the present disclosure relates to a program element which, if a processing unit of an ADAS sensor data processing unit is programmed therewith, instructs the processing unit to perform an ADAS sensor data evaluation method according to the present disclosure, as well as a computer-readable medium on which such a program element is stored.

The present disclosure can in particular be implemented in digital electronic circuits, computer hardware, firmware or software.

BRIEF DESCRIPTION OF THE DRAWINGS

Exemplary embodiments of the invention, further details and figures are explained below, wherein:

FIG. 3 shows an ADAS sensor system having a separate ADAS sensor data processing unit, which makes it possible to transmit and store lossy-compressed sensor data, FIG. 4 shows an intelligent ADAS sensor system having a processing unit for processing lossy-compressed sensor data, which is integrated into the sensor module.

DETAILED DESCRIPTION

Figure 1:
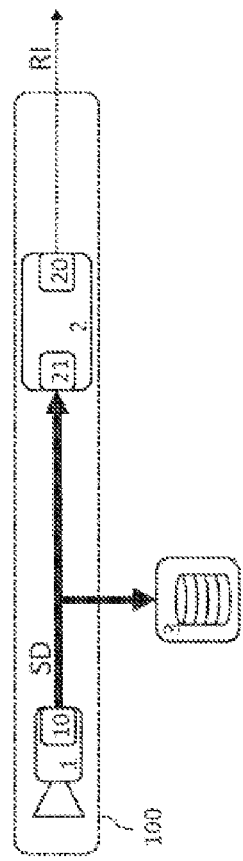
FIG. 1 shows a first possibility for storing sensor data of an ADAS sensor system.

FIG. 1 schematically shows how, in a current ADAS sensor system 100, sensor data can be saved for development and test purposes. The ADAS sensor system 100 comprises an ADAS sensor head 1, e.g., a camera, radar, lidar or laser scanner sensor. The ADAS sensor head 1 has a first data output interface 10, via which sensor data (SD) can be output, in an uncompressed manner, to a data input interface 21 of a processing unit 2 and to a storage unit 3 (outside the ADAS sensor system). The processing unit 2 processes the uncompressed ADAS sensor data (SD) in order to extract information (RI) relevant to ADAS or AD functions. The extracted relevant information (RI) is output to an ADAS or AD system via an information output interface 20 of the ADAS sensor system 100. In the case of this construction, ADAS sensor data (SD) are thus discharged and saved without additional compression.

Figure 2:
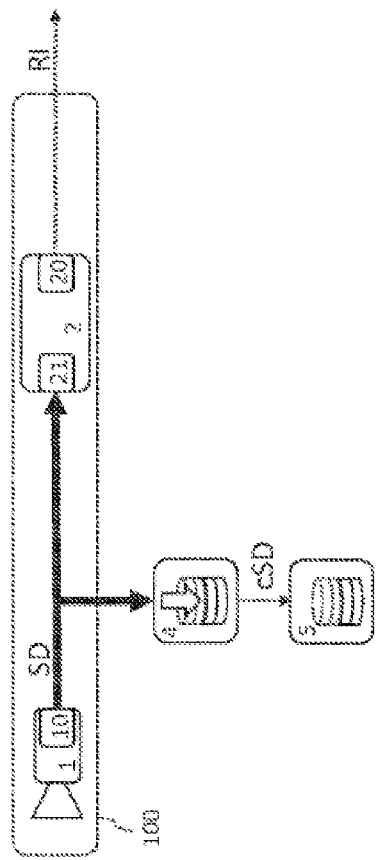
FIG. 2 shows a second possibility for storing sensor data of an ADAS sensor system, by lossless compressing of the sensor data.

FIG. 2 shows how, in the case of an ADAS sensor system 100 (cf. FIG. 1), the sensor data (SD) can be additionally compressed losslessly. In an external compression unit 4 which receives the uncompressed ADAS sensor data (SD) from the first data output interface 10 of the ADAS sensor head 1, the sensor data are compressed losslessly and the compressed data (cSD) are transmitted to a storage unit 5. Here, the data quantity to be stored can be reduced approximately by a factor 2. Nevertheless, high costs are still incurred for the data quantities to be stored, since the storage unit 5 has to be appropriately dimensioned.

One solution to the problem of the high costs for storing the sensor data is lossy compression which makes possible significantly higher compression rates (~> factor 10 less).

In FIG. 3, an ADAS sensor system 30 having a separate ADAS sensor data processing unit 40 is depicted schematically, which makes it possible to transmit and store sensor data compressed to a significantly higher degree. The ADAS sensor head 1 captures data which are transmitted to an internal compression module 6. The internal compression module 6 is designed to subject the ADAS sensor data to lossy compression and to transmit the lossy-compressed ADAS sensor data (IcSD) to a data output interface 300. The (lossy)-compressed ADAS sensor data (IcSD) are output by the data output interface 300 of the ADAS sensor system 30 to an input interface 401 of an external (e.g., central) ADAS sensor data processing unit 40.

The input interface 401 transmits the compressed ADAS sensor data (IcSD) to a decompression module 7 of the ADAS sensor data processing unit 40. The decompression module 7 is designed to unpack the compressed ADAS sensor data (IcSD). Since these have been subjected to lossy compression, the decompressed ADAS sensor data (IdSD) have differences compared to the originally captured sensor data (SD), i.e., the raw data, they are fraught with losses of detailed information. The decompressed ADAS sensor data (IdSD) are transmitted to a processing unit 44 of the ADAS sensor data processing unit 40. The processing unit 44 is configured to process the lossy-decompressed ADAS sensor data (IdSD), i.e., to ascertain information relevant to an ADAS/AD function from the sensor data.

The algorithms which are used on the processing unit 44 are either developed specially for lossy data, or the suitability of existing algorithms for lossless (raw) data has to be demonstrated for the lossy data. The ascertained relevant information (RI) is output to an ADAS or AD control system via an output interface 400 of the processing unit 44 or of the external ADAS sensor data processing unit 40.

The lossy-compressed ADAS sensor data (IcSD) can additionally be output by the data output interface 300 of the ADAS sensor system 30 to an external storage unit 9 where they are stored for test or validation purposes.

The external ADAS sensor data processing unit 40 can in particular be configured in the form of or as an integral part of a central control device for assisted or automated driving (ADCU). The ADCU can receive lossy-compressed sensor data (IcSD) from multiple ADAS sensors 30 of the same or different type (not depicted in FIG. 3). In particular, camera, lidar, laser scanner, radar and/or ultrasonic sensors can serve as ADAS sensors 30. In this case, it is not absolutely essential that all ADAS sensors compress their data. At a lower data rate (e.g., ultrasonic sensors), this data can also be transmitted in an uncompressed manner to the ADCU. At high data rates (e.g., of the camera, high-resolution radar, lidar or laser scanner sensors), a high (and therefore lossy) compression by the sensor can be required or advantageous prior to transmission to the ADCU.

FIG. 4 shows the schematic representation of an intelligent ADAS sensor system 200, i.e., of an ADAS sensor having an integrated processing unit 22, which likewise makes it possible to store sensor data compressed to a considerably higher degree. The main difference from the entire system from FIG. 3 is that the sensor head 1 and processing unit 22 are arranged here in a common housing ("one-box solution"). The ADAS sensor system 200 can be conceived of as a combination of two subassemblies 24, 28 (dashed borders in FIG. 4), wherein the first subassembly 24 corresponds to the ADAS sensor 30 from FIG. 3 and the second subassembly 28 corresponds to the sensor data processing unit 40 from FIG. 3. In this case, the special feature is that, within the ADAS sensor system 200, the data (SD) captured by the sensor head 1 are first of all subjected to lossy compression by means of an integrated compression module 6, in order to then be unpacked again by the integrated decompression module 7. From a conventional point of view, this seems to be virtually nonsensical within a sensor, since it is accepted that the processing unit 22 processes the lossy-decompressed ADAS sensor data (IdSD) and not the "complete" raw data (SD) which would of course already be available within the ADAS sensor system 200. However, the ADAS sensor system 200 does make it possible to discharge the lossy-compressed sensor data (IcSD) via an output interface 240 of the sensor subassembly 24 to an external storage unit 9. Another big advantage is that the same algorithms can be used for the integrated processing unit 22 in order to ascertain the relevant information (RI) which is used in the processing unit 44 of an external ADAS sensor data processing unit 40 (cf. FIG. 3). The ascertained relevant information (RI) is output to an ADAS or AD control system via an output interface 280 of the processing unit 22 or of the intelligent ADAS sensor system 200.

Two further exemplary embodiments are explained in greater detail with reference to FIGS. 5 and 6. In both cases, the ADAS sensor head 1 is an imaging sensor, that is to say a camera sensor 14. The camera sensor 14 can in particular be a monocular camera sensor. The ADAS sensor data (SD) are, in this case, (two-dimensional) image data. Alternatively, the camera sensor could supply three-dimensional image data, e.g., as a stereo camera sensor.

In the case of a monocular camera sensor, an at least partial 3D reconstruction of the surroundings of the vehicle is important for many ADAS/AD functions. For example, it is essential for collision avoidance or emergency braking assistants to be able to estimate the distance from possible (dynamic or stationary) collision objects as precisely as possible. To this end, the determination of the optical flow (OF) from at least two images of a camera sensor, which are captured temporally offset (or successively), is extremely important. The optical flow (OF) indicates the displacement of a feature in a first image, compared with the same feature in a second image captured later. The determination of the optical flow (OF) is an important algorithm for machine vision. However, a lossy compression of image data leads to an adverse impact on the flow vectors. It is therefore provided here that the optical flow be calculated prior to the compression and that, for example, following a pre-selection, the flow vectors be treated separately or transmitted losslessly to a sensor data evaluation unit 70 or subassembly 58.

Figure 5:
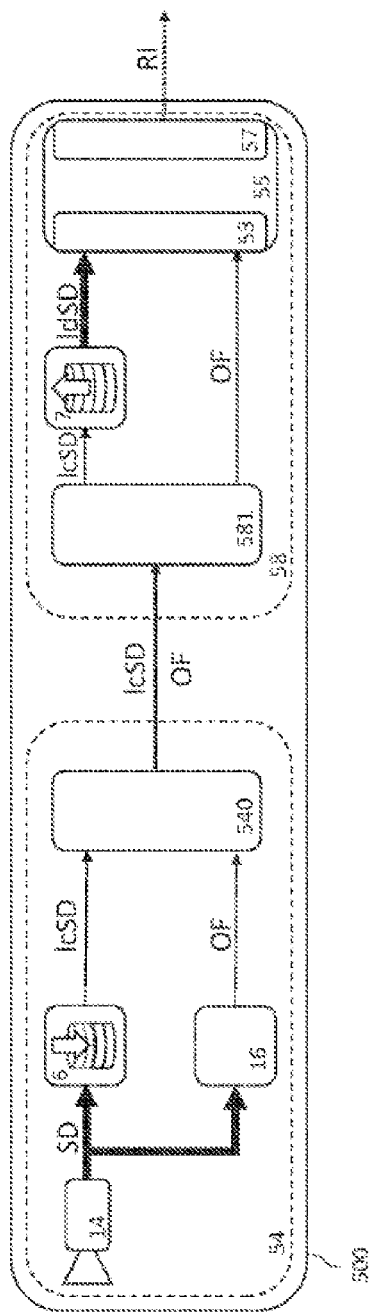
FIG. 5 shows an intelligent ADAS camera sensor module having an optical flow calculation module on the basis of the captured image data.

FIG. 5 schematically shows an intelligent ADAS camera sensor system 500 which can be compared, in terms of the basic architecture, to the ADAS sensor system 200 shown in FIG. 4. "Raw" image data (SD) are captured by the camera sensor 14 in the camera sensor subassembly 54 (left dashed region). The raw image data (SD) are provided, in addition to the compression module 6, to an optical flow calculation module 16 as well. The optical flow calculation module 16 is designed to ascertain the optical flow (OF) between uncompressed image data (SD) of two individual images captured at different times by the camera sensor 14. The ascertained optical flow (OF) is transmitted to an output interface 540 of the camera sensor subassembly. The lossy-compressed image data (IcSD) are transmitted by the compression module 6 to the output interface 540 of the camera sensor subassembly 54.

An input interface 581 of an image data processing subassembly 58 (right dashed region) receives the ascertained optical flow (OF) and the lossy-compressed image data (IcSD) from the output interface 540 of the camera sensor subassembly 54. The latter are unpacked by a decompression module 7 and transferred as (lossy-) decompressed image data (IdSD) to an input location 53 of the processing unit 55. The ascertained optical flow (OF) is also present on the input side of the processing unit 55. Taking account of the optical flow, the processing unit 55 processes the decompressed image data in order to ascertain the information (RI) relevant to the ADAS/AD function(s). The relevant information is output via the output 57 of the processing unit 55.

The ascertained optical flow (OF) and the lossy-compressed image data (IcSD) can be output by the output interface 540 of the camera sensor subassembly 54 for storage (cf. FIGS. 3 and 4). This is not depicted in FIG. 5.

Figure 6:
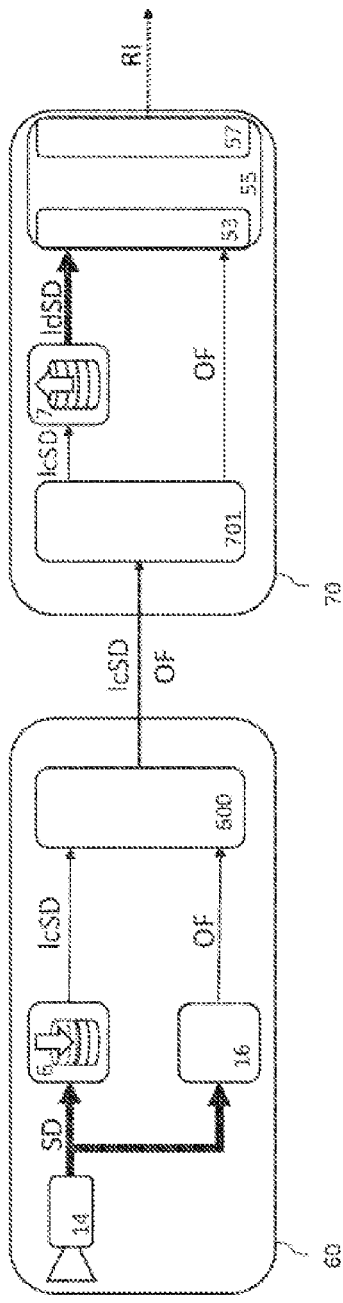
FIG. 6 shows an ADAS camera sensor system having an optical flow calculation module on the basis of the captured image data and a separate image processing unit.

FIG. 6 schematically shows an ADAS camera system 60 having an external image data processing unit 70. Conceptually, this system can be conceived of in a similar manner to that shown in FIG. 5, the only difference being that the camera sensor subassembly 54 there corresponds, here, to an independent camera sensor module 60 ("satellite camera sensor") having partial image pre-processing (OF calculation module 16) and an output interface 600 of the camera sensor module 60. The output interface 600 of the camera sensor module 60 transmits the compressed image data (IcSD) and the calculated optical flow (OF), in a wireless or wired manner, to an input interface 701 of an external (or central) image data processing unit 70 (or to a storage unit which is not depicted). For the sake of simplicity, the processing unit 55, the input location 53 thereof and the output 57 thereof of the external image data processing unit 70 are provided with the same reference numerals in FIG. 6 as in FIG. 5.

It is of course possible to provide another processing unit in an external image processing unit 70 or to implement other or additional image processing algorithms on the processing unit 55. It is also possible that, in addition to the image processing in an external or central sensor data processing unit, sensor data of other ADAS sensors are also processed—whether in the form of raw sensor data (SD) or in the form of lossy-decompressed sensor data (IdSD). In this case, the image processing unit 70 would be an element of an external ADAS sensor data processing unit 40, or the elements of the image processing unit 70 would be integrated into an external ADAS sensor data processing unit 40. FIGS. 5 and 6 are, above all, intended to illustrate, by way of example, the taking account of the optical flow (OF) calculated prior to compression.

The invention claimed is:

1. An ADAS sensor system for a vehicle, comprising:
   an ADAS sensor subassembly, comprising
     at least one vehicle ADAS sensor configured to generate data regarding an environment of the vehicle when mounted thereto, and
     a compression module having an input connected to an output of the at least one vehicle ADAS sensor at which the generated data is received, the compression module preprocesses the generated data by being configured to subject the generated data to lossy compression to generate lossy compression sensor data, and
   an ADAS sensor data processing subassembly comprising
     a decompression module configured to receive and decompress the lossy compression sensor data to generate decompressed lossy sensor data, the decompression module performed by a programmed electronic circuit,
     a processing unit configured to process the decompressed lossy sensor data by extracting information relevant to an ADAS/automated driving (AD) function being ascertained from the decompressed lossy sensor data, and outputting the ascertained information relevant to the ADAS/AD function, the processing unit performed by the programmed electronic circuit,
   wherein the ADAS sensor system comprises an electronics housing and the ADAS sensor subassembly and the ADAS sensor data processing subassembly are integrated into the electronics housing.

2. The ADAS sensor system according to claim 1, wherein the at least one vehicle ADAS sensor is a camera sensor and the data generated by the at least one ADAS sensor are image data.

3. The ADAS sensor system according to claim 2, wherein the processing unit comprises an image processing unit which is configured to detect objects, lane markings, road signs, traffic light signals and light sources and/or to spatially reconstruct an environment of the vehicle.

4. The ADAS sensor system according to claim 2, wherein the ADAS sensor subassembly further comprises
   an optical flow calculation module having an input connected to the output of the at least one vehicle ADAS sensor, the input receiving the generated data from the at least one ADAS vehicle sensor, the optical flow calculation module performing pre-processing of the generated data by being configured
     to ascertain an optical flow between the image data of two individual images captured at different times by the camera sensor, and
     to provide the ascertained optical flow to the processing unit.

5. The ADAS sensor system according claim 4, wherein the optical flow calculation module ascertains the optical flow on the generated data before lossy compression is performed thereon, and the optical flow is transmitted losslessly by the optical flow calculation module to an input of the processing subassembly.

6. A vehicle having the ADAS sensor system according to claim 1.

7. An advanced driver assistance system (ADAS) sensor data method comprising
   generating sensor data by a vehicle ADAS sensor,
   performing, by a compression unit having an input coupled to an output of the vehicle ADAS sensor, lossy compression on the sensor data to generate lossy compressed sensor data,
   receiving and decompressing the lossy-compressed sensor data to generate lossy decompressed sensor data,
   processing the lossy decompressed sensor data in order to ascertain information relevant to an ADAS function, and
   outputting the ascertained information relevant to the ADAS function,
   wherein generating the sensor data and performing lossy compression are performed in a sensor subassembly, and receiving and decompressing the lossy-compressed sensor data, processing the lossy decompressed sensor data and outputting the ascertained information are performed by a processing subassembly having an input coupled to an output of the sensor subassembly and having programmed electronic circuitry, and the sensor subassembly and the processing subassembly are integrated into a single electronics housing.

8. A software program stored on a non-transitory computer-readable medium and having program instructions which, when executed by computer hardware, cause the computer hardware to perform the method according to claim 7.

9. The non-transitory computer-readable medium on which a program element according to claim 8 is stored.

10. The method according to claim 7, wherein the at least one vehicle ADAS sensor comprises at least one camera sensor and the sensor data comprises image data.

11. The method according to claim 10, further comprising:
performing, by an optical flow calculation module having an input connected to the output of the at least one vehicle ADAS sensor, pre-processing of the image data by ascertaining an optical flow between the image data of two individual images captured at different times by the at least one camera sensor, and
transmitting, by the optical flow calculation module, the ascertained optical flow from an output of the optical flow calculation module to the input of the processing subassembly, wherein the ascertained information relevant to an ADAS function is based on the ascertained optical flow.

12. The method according to claim 11, wherein the optical flow is ascertained from the generated sensor data before the lossy compression is performed thereon, and the optical flow is transmitted losslessly to the input of the processing subassembly.

13. A vehicle function sensor system, comprising:
a sensor subassembly, comprising
at least one vehicle sensor configured to generate data regarding an environment of the vehicle when mounted thereto, and
at least one electronic circuit having an input connected to an output of the at least one vehicle sensor at which the generated data is received, the at least one electronic circuit configured to pre-process the generated data by subjecting the generated data to lossy compression generating lossy compression sensor data, a sensor data processing subassembly, comprising
at least one electronic circuit having an input coupled to an output of the electronic circuit of the sensor subassembly and configured to receive and decompress the lossy compression sensor data for generating decompressed lossy sensor data, and to process the decompressed lossy sensor data by extracting information relevant to a vehicle function being ascertained from the decompressed lossy sensor data and outputting the ascertained information relevant to the vehicle function, and
an electronics housing, wherein the sensor subassembly and the sensor data processing subassembly are integrated into the electronics housing.

14. The vehicle function sensor system according to claim 13, wherein the at least one vehicle sensor comprises at least one camera sensor and the data generated by the at least one vehicle sensor are image data.

15. The vehicle function sensor system according to claim 14, wherein the sensor subassembly or the at least one electronic circuit thereof is configured to pre-process the image data by ascertaining an optical flow between the image data of two individual images captured at different times by the at least one camera sensor, and by transmitting the ascertained optical flow to the input of the at least one electronic circuit of the sensor data processing subassembly, wherein the ascertained information relevant to the vehicle function is based on the ascertained optical flow.

16. The vehicle function sensor system according to claim 15, wherein the optical flow is ascertained from the generated sensor data before lossy compression is performed thereon, and the optical flow is transmitted losslessly to the input of the at least one electronic circuit of the sensor data processing subassembly.

* * * * *